United States Patent
Chen

(10) Patent No.: US 11,870,406 B2
(45) Date of Patent: Jan. 9, 2024

(54) FAST AUTOMATIC GAIN CONTROL CIRCUIT

(71) Applicant: Rafael Microelectronics, Inc., Hsinchu County (TW)

(72) Inventor: Kuan-Ming Chen, Hsinchu County (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 121 days.

(21) Appl. No.: 17/693,445

(22) Filed: Mar. 14, 2022

(65) Prior Publication Data

US 2023/0291375 A1 Sep. 14, 2023

(51) Int. Cl.
*H03G 3/30* (2006.01)
*H03F 3/195* (2006.01)

(52) U.S. Cl.
CPC .......... *H03G 3/3068* (2013.01); *H03F 3/195* (2013.01); *H03F 2200/294* (2013.01); *H03F 2200/451* (2013.01)

(58) Field of Classification Search
CPC . H03G 3/3068; H03F 3/195; H03F 2200/294; H03F 2200/451
See application file for complete search history.

(56) References Cited

U.S. PATENT DOCUMENTS

| | | | |
|---|---|---|---|
| 2004/0032825 A1* | 2/2004 | Halford | H04L 27/0008 370/208 |
| 2011/0085625 A1* | 4/2011 | Urakawa | H03G 1/0088 375/345 |
| 2015/0117571 A1* | 4/2015 | Matsui | H04L 27/2649 375/340 |
| 2020/0014353 A1* | 1/2020 | Kan | H03G 3/3078 |

* cited by examiner

*Primary Examiner* — Vineeta S Panwalkar
(74) *Attorney, Agent, or Firm* — Min-Lee Teng

(57) ABSTRACT

An automatic gain control circuit includes a control circuit for controlling a power detector, wherein the control circuit detects a power level change of an input signal and generates a control signal to the power detector so that the power detector can respond to the power level change of the input signal quickly.

16 Claims, 9 Drawing Sheets

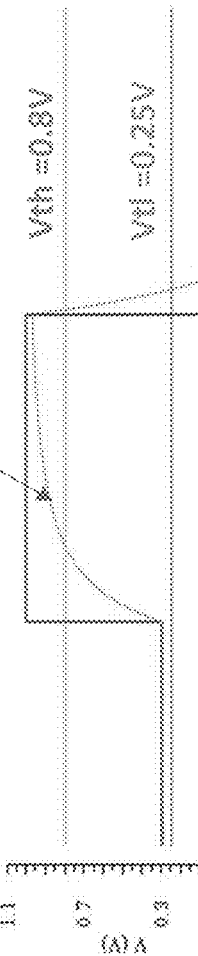
FIG. 2C
FIG. 2D
FIG. 2E

FAST AUTOMATIC GAIN CONTROL CIRCUIT

BACKGROUND OF THE INVENTION

1. Field of the Invention

The invention relates to an automatic gain control circuit for controlling an amplifier for inputting signals.

2. Description of the Prior Art

FIG. 1A illustrates a conventional automatic gain control circuit for controlling an amplifier 102 for inputting signals 101, wherein the automatic gain control circuit comprises: a power detector 104 coupled to the amplifier 102 to receive a signal 103 outputted from the amplifier 102 and to output a voltage level V_PD representing a power level of the signal 103; and an automatic gain control logic circuit that receives the voltage level V_PD and adjusts the gain of the LNA according to the voltage level V_PD.

The power detector 104 can use an RMS voltage detector or a peak voltage detector for detecting the power level of the inputting signals. A peak voltage detector is good at dealing with burst interference. However, when in-band power changes abruptly from high to low, such as from −10 dBm to −40 dBm, the peak voltage detector cannot respond immediately, as shown in FIG. 1B.

Therefore, what is needed is a new way to design an automatic gain control circuit to overcome the above-mentioned issues.

SUMMARY OF THE INVENTION

One objective of the present invention is to provide a fast automatic gain control circuit for controlling an amplifier for inputting signals so that a power detector can respond to abrupt power changes quickly.

One objective of the present invention is to provide a fast automatic gain control circuit with a control circuit for generating a flag indicating a fast mode or a normal mode, wherein the power detector operates according to the flag, wherein when the flag indicates the fast mode, the settings of the power detector can be altered for responding to abrupt power changes quickly.

The present invention discloses an automatic gain control circuit, wherein the automatic gain control circuit comprises: a power detector coupled to the amplifier to receive a first signal outputted from the amplifier and to output a first voltage level representing a first power level of the first signal; and a control circuit for controlling the power detector, wherein the control circuit detects a power level change of the first signal and generates a control signal to the power detector for responding to the power level change of the first signal.

In one embodiment, the automatic gain control circuit comprises an automatic gain control logic circuit, wherein the control circuit sends the control signal to the automatic gain control logic circuit for adjusting the gain step of the automatic gain control logic circuit to cut short the total settling time in response to the power level change of the first signal.

In one embodiment, the control circuit comprises a voltage level detector coupled to the first signal to output a second voltage level representing a second power level of the first signal, wherein the control signal is switching from a first level to a second level that is maintained for a pre-defined period when the second voltage level becomes smaller than a pre-defined low-threshold.

In one embodiment, the control circuit comprises a voltage level detector coupled to the first signal to output a second voltage level representing a second power level of the first signal, wherein the control signal is switching from a first level to a second level that is maintained for a pre-defined period when the second voltage level becomes larger than a pre-defined high-threshold or smaller than a pre-defined low-threshold.

In one embodiment, the voltage level detector comprises an RMS voltage detector coupled to the first signal to output the second voltage level representing the second power level of the first signal.

In one embodiment, the control circuit comprises a first comparator, a second comparator, and a flag generator, wherein the first comparator compares a power level outputted from the RMS voltage detector with a pre-defined high-threshold, and the second comparator compares the power level outputted from the RMS power level detector with a pre-defined low-threshold, wherein the flag generator generates the control signal according to the outputs of the first comparator and the second comparator.

In one embodiment, a clock is inputted to the flag generator, wherein the pre-defined period is generated according to the clock period of the clock.

In one embodiment, as shown in FIG. 2F, the first signal 203 is inputted to the power detector 204, wherein the power detector 204 comprises a peak voltage detector 204a and an RMS voltage detector 204b, wherein the peak voltage detector 204a is selected for generating the power level 209 of the power detector 204 when the control signal 207 is in a normal mode, and the RMS voltage detector 204b is selected for generating the power level 209 of the power detector 204 when the control signal 207 is in a fast mode by using a multiplexer 204c.

In one embodiment, as shown in FIG. 2F, the power detector 204 comprises a peak voltage detector 204a with a filter 204d for reducing the ripples of the output of the power detector, wherein the filter 204d has a first discharging time constant when the control signal 207 is in a fast mode, and the filter 204d has a second discharging time constant when the control signal 207 is in a normal mode, wherein the first discharging time constant is smaller than the second discharging time constant. In one embodiment, the filter 204d is an RC filter for reducing the ripples of the output of the power detector.

In one embodiment, the automatic gain control circuit comprises an automatic gain control logic circuit, wherein the control circuit sends the control signal to the automatic gain control logic circuit for adjusting the gain step of the automatic gain control logic circuit to cut short the total settling time.

In one embodiment, the automatic gain control circuit comprises an automatic gain control logic circuit, wherein the control circuit sends the control signal to the automatic gain control logic circuit for adjusting the speed of the clock that is used by the automatic gain control circuit.

In one embodiment, the signals are RF signals.
In one embodiment, the signals are IF signals.
In one embodiment, the amplifier is an LNA (low-noise amplifier) for amplifying RF signals.

The detailed technology and above preferred embodiments implemented for the present invention are described in the following paragraphs accompanying the appended drawings for people skilled in this field to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein:

FIG. 2C illustrates a timing diagram of the output of the power detector in FIG. 2A;

FIG. 2D illustrates a timing diagram of the output of the comparator circuit 211 in FIG. 2B;

FIG. 2E illustrates a timing diagram of the output of the flag generator in FIG. 2B;

DETAILED DESCRIPTION OF EMBODIMENT

The detailed explanation of the present invention is described as follows. The described preferred embodiments are presented for purposes of illustrations and description, and they are not intended to limit the scope of the present invention.

Figure 1A:
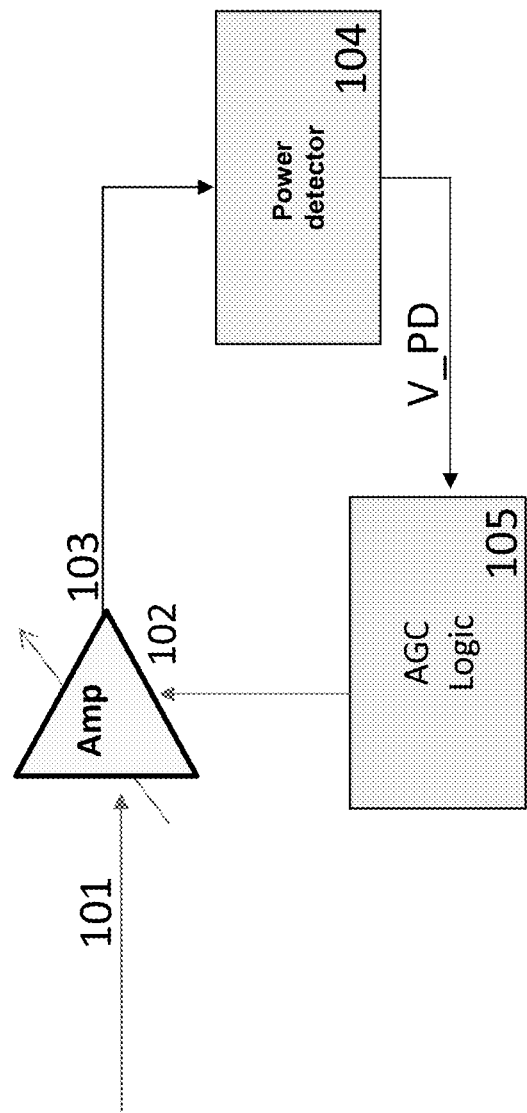
FIG. 1A shows a structure of a conventional automatic gain control circuit.
Figure 1B:
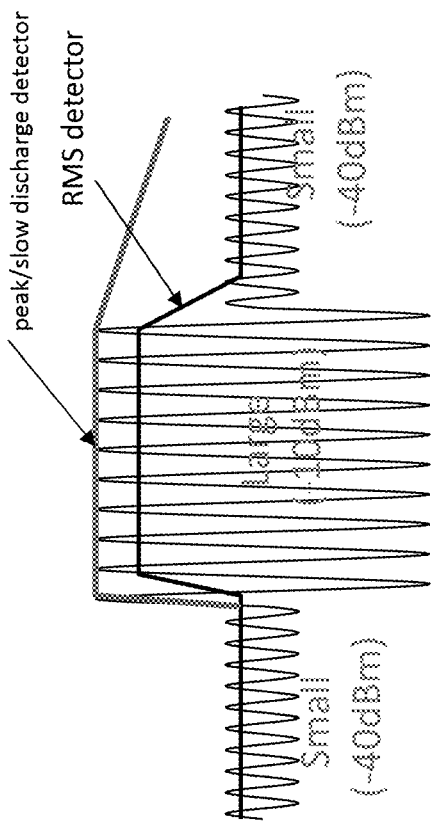
FIG. 1B shows an output of a power detector, either in peak voltage mode or RMS voltage mode, of the conventional automatic gain control circuit.
Figure 2A:
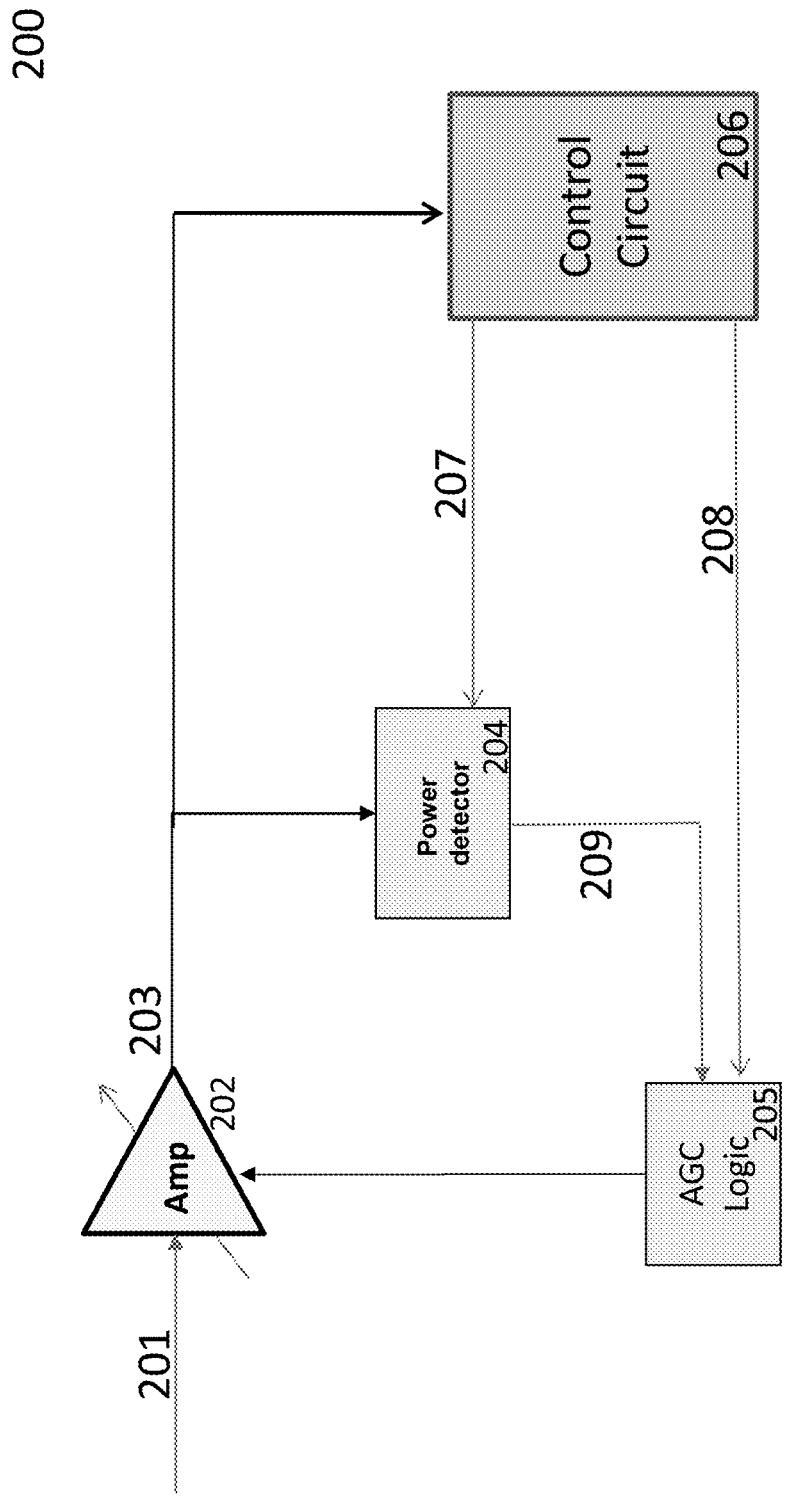
FIG. 2A illustrates an automatic gain control circuit for controlling an amplifier for inputting signals according to one embodiment of the present invention.

FIG. 2A illustrates an automatic gain control circuit 200 for controlling an amplifier such as an LNA (Low-Noise Amplifier) 202 for inputting signals 201 according to one embodiment of the present invention. As shown in FIG. 2A, the automatic gain control circuit 200 comprises: a power detector 204 coupled to the amplifier 202 to receive a first signal 203 outputted from the amplifier 202 and to output a first voltage level 209 representing a first power level of the first signal 203; and a control circuit 206 for controlling the power detector 204, wherein the control circuit 206 detects a power level change of the first signal 203 and generates a control signal 207 to the power detector 204 for responding to the power level change of the first signal.

In one embodiment, as shown in FIG. 2A, the automatic gain control circuit 200 comprises an automatic gain control logic circuit 205 that receives the first voltage level 209 from the power detector 204, wherein the control circuit 206 sends the control signal 208 to the automatic gain control logic circuit 205 for adjusting the gain step of the automatic gain control logic circuit 205 to cut short the total settling time in response to the power level change of the first signal.

Figure 2B:
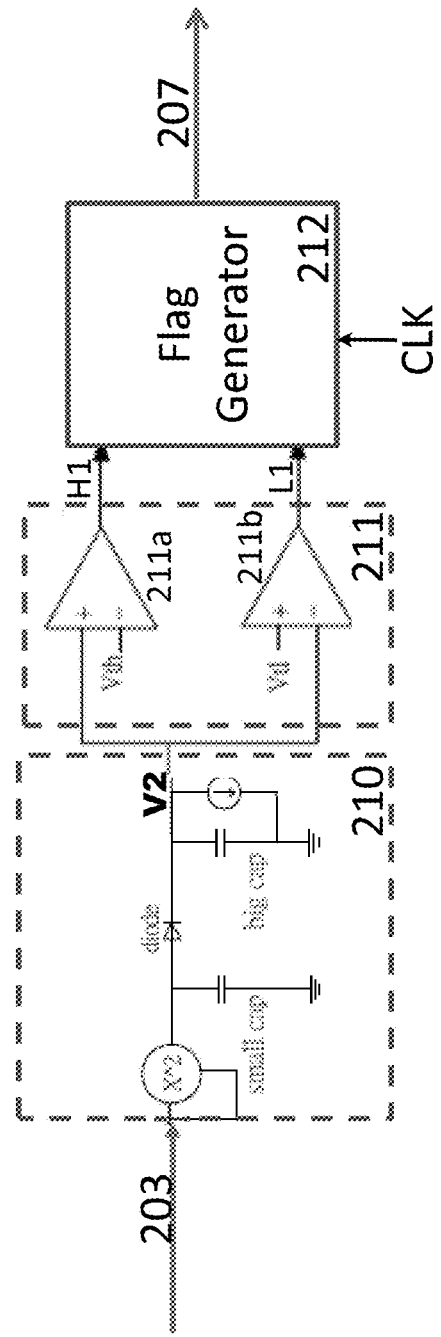
FIG. 2B illustrates a structure of the control circuit of the automatic gain control circuit in FIG. 2A according to one embodiment of the present invention.
Figure 2F:
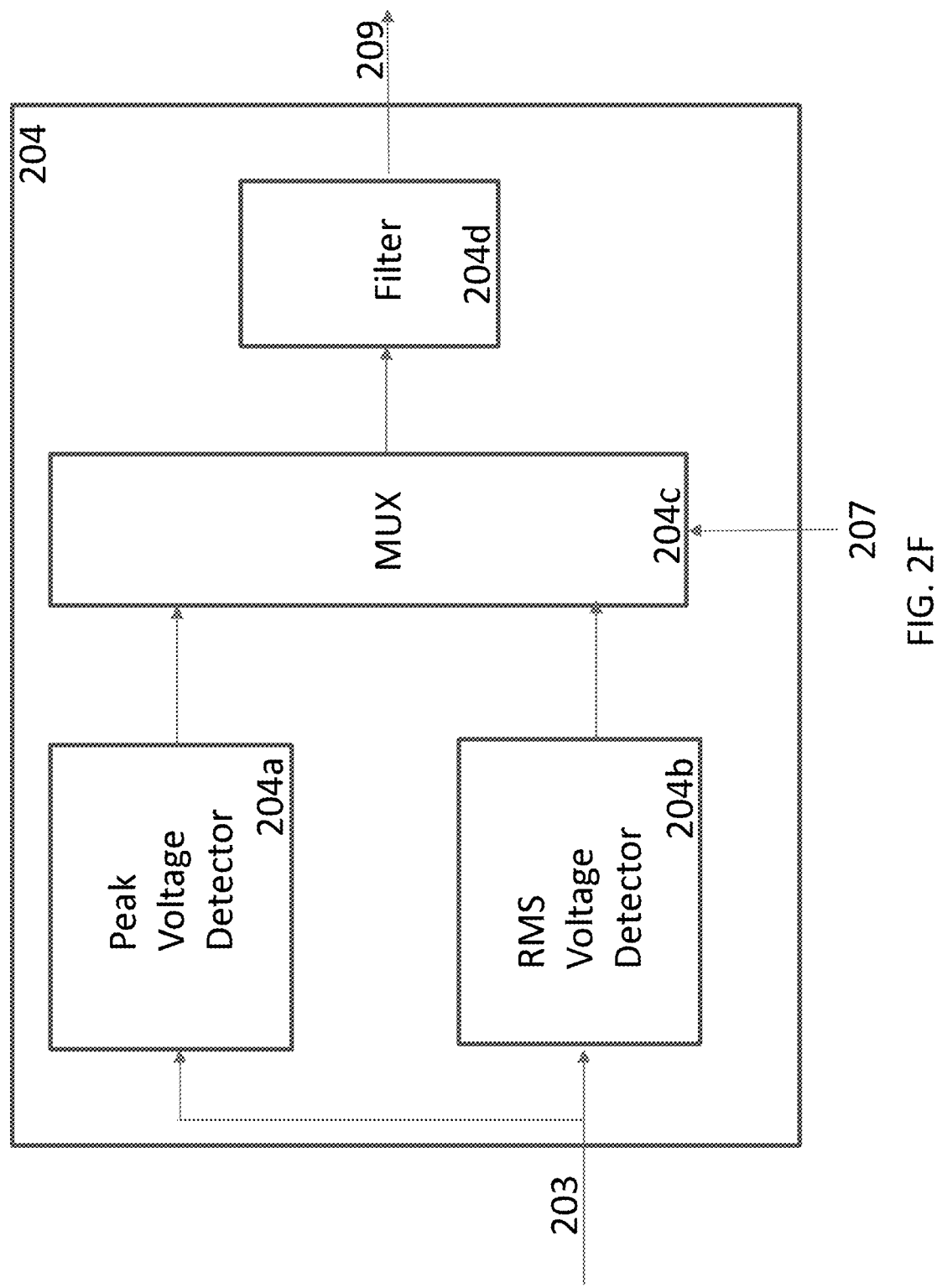
FIG. 2F illustrates a structure of a power detector in FIG. 2A according to one embodiment of the present invention.

In one embodiment, as shown in FIG. 2B, the control circuit 206 comprises a voltage level detector 210 coupled to the first signal 203 and to output a second voltage level V2 representing a second power level of the first signal 203 that is inputted to the control circuit 206, wherein the control signal 207 is switching from a first level to a second level that is maintained for a pre-defined period when the second voltage level V2 becomes smaller than a pre-defined low-threshold.

In one embodiment, as shown in FIG. 2B, the control circuit 206 comprises a voltage level detector 210 coupled to the first signal 203 and to output a second voltage level V2 representing a second power level of the first signal 203 that is inputted to the control circuit 206, wherein the control signal 207 is switching from a first level to a second level that is maintained for a pre-defined period when the second voltage level V2 becomes smaller than a pre-defined low-threshold or smaller than a pre-defined low-threshold.

In one embodiment, the voltage level detector 210 comprises an RMS voltage detector coupled to the first signal 203 to output the second voltage level V2 representing the second power level of the first signal 203.

In one embodiment, as shown in FIG. 2B, the control circuit comprises a comparator circuit 211 including a first comparator 211a and a second comparator 211b, and a flag generator 212, wherein the first comparator 211a compares a power level outputted from the voltage level detector 210 with a pre-defined high-threshold Vth and outputs a first logic level signal H1, and the second comparator 211b compares the power level outputted from the voltage level detector 210 with a pre-defined low-threshold Vtl and outputs a second logic level signal L1, wherein the flag generator 212 generates the control signal 207 according to the first logic level signal H1 and the second logic level signal L1.

In one embodiment, as shown in FIG. 2B, a clock CLK is inputted to the flag generator for clocking the flag generator, wherein the pre-defined period is generated according to the clock period of the clock CLK.

In one embodiment, the pre-defined period is 2.5 times the clock period of the clock CLK.

FIG. 2C illustrates a timing diagram of the output 209 of the power detector 204 in FIG. 2A, FIG. 2D illustrates a timing diagram of the output H1, L1 of the comparator circuit 211 in FIG. 2B, FIG. 2E illustrates a timing diagram of the output 207 of the flag generator 212 in FIG. 2B.

Please refer to FIG. 2C-2E. A pulse H1 is generated when the output 209 of the power detector 204 crosses the high-threshold Vth such as 0.8V, and a pulse L1 is generated when the output 209 of the power detector 204 crosses the low-threshold Vtl such as 0.25V, as shown in FIG. 2C and FIG. 2D. The pulse H1 will allow the control signal to fall to a logic low-level for a pre-defined period T1 before going back to a logic high-level, and the pulse L1 will also allow the control signal to fall to the logic low-level for a pre-defined period T2 before going back to the logic high-level, wherein when the control signal 207 is in logic low-level, it represents a fast mode, and when the control signal 207 is in logic high-level, it represents a normal mode, as shown in FIG. 2E.

In one embodiment, the power detector 204 comprises a peak voltage detector and an RMS voltage detector, wherein the output of the peak voltage detector is selected when the control signal is in the normal mode, and the output of the RMS voltage detector is selected when the control signal is in the fast mode.

In one embodiment, the power detector 204 comprises a peak voltage detector with an RC filter, wherein the RC filter has a first discharging time constant when the control signal is in the fast mode, and the RC filter has a second discharging time constant when the control signal is in the normal mode, wherein the first discharging time constant is shorter than the second discharging time constant.

In one embodiment, the control circuit 206 comprises an RMS power level detector coupled to the amplifier to receive the first signal and a comparator circuit coupled to the RMS power level detector, wherein the comparator circuit comprises a first comparator compares a power level outputted from the RMS power level detector with a first pre-defined threshold for generating the control signal.

In one embodiment, as shown in FIG. 2A, the control circuit 206 sends a control signal 208 to the automatic gain control logic circuit 205 for adjusting the speed of the clock that is used by the automatic gain control circuit.

In one embodiment, the control signal 208 and control signal 207 are the same.

In one embodiment, as shown in FIG. 2A, the control circuit 206 sends a control signal 208 to the automatic gain control logic circuit 205 for adjusting the gain step of the automatic gain control logic circuit 205 to cut short the total settling time in response to the power level change of the first signal 203.

Figure 3A:
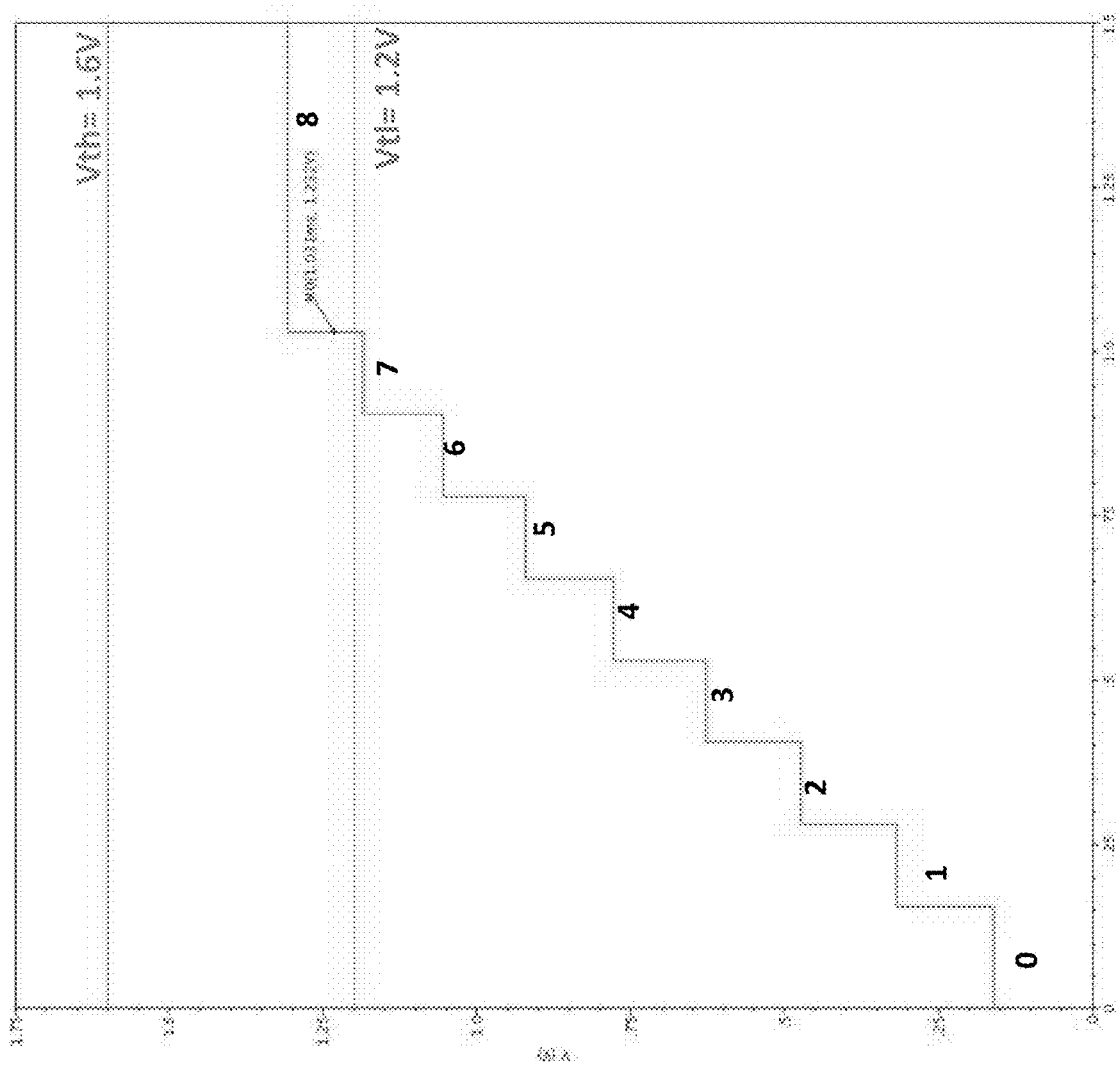
FIG. 3A illustrates the gain step diagram of the automatic gain control logic circuit in FIG. 2A, wherein the gain step increases by one step for each adjusting step.
Figure 3B:
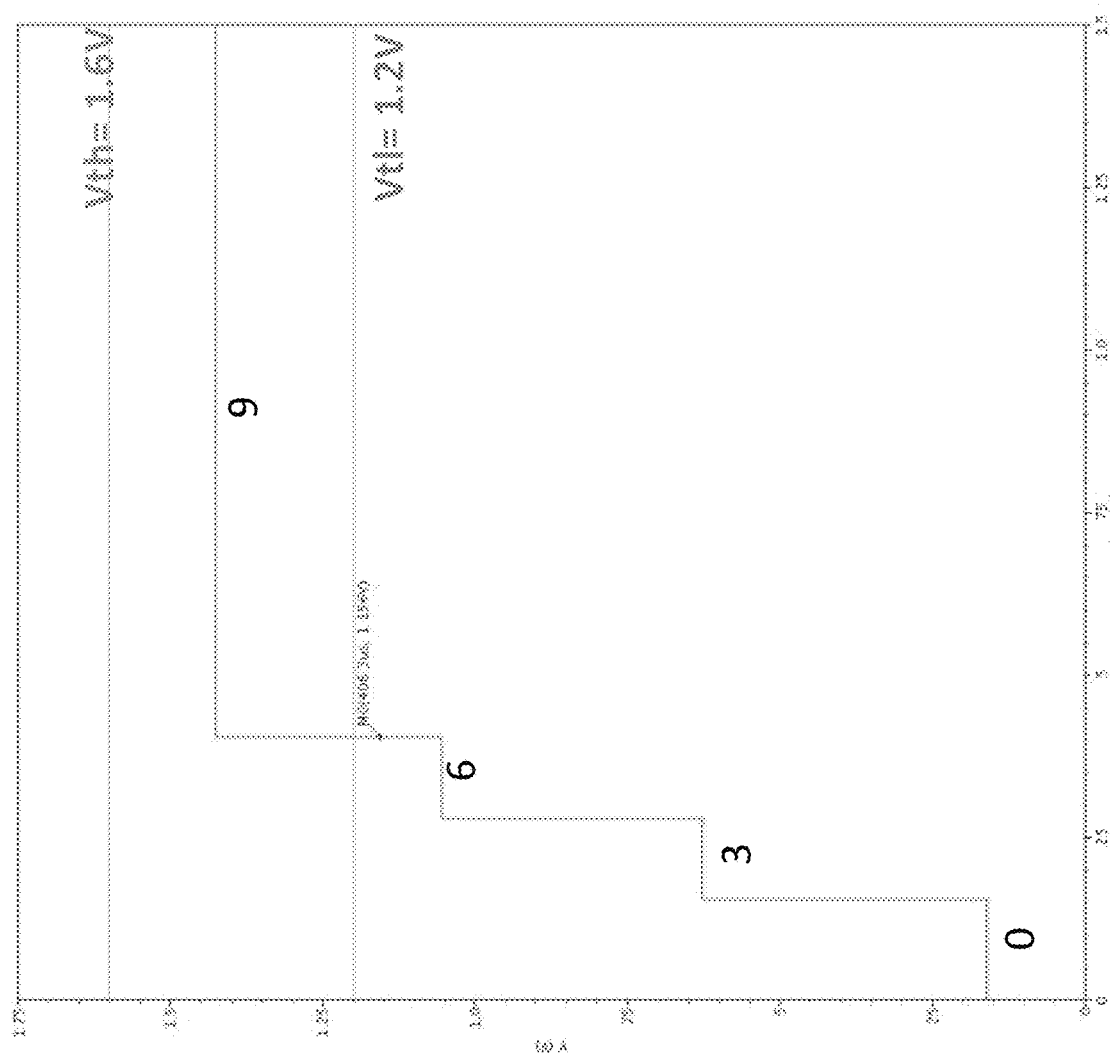
FIG. 3B illustrates the gain step diagram of the automatic gain control logic circuit in FIG. 2A according to one embodiment of the present invention, wherein the gain step increases by three steps for each adjusting step.
Figure 3C:
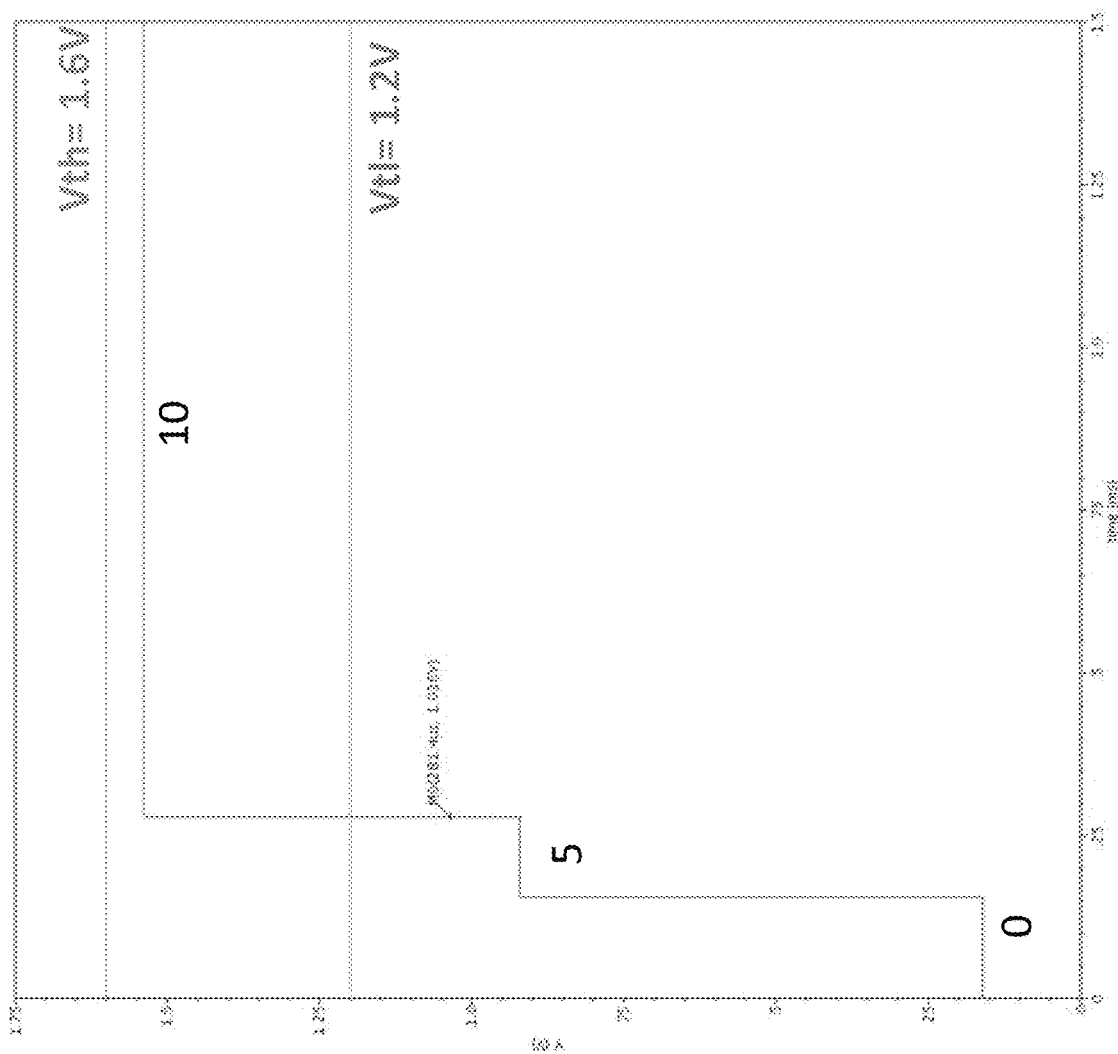
FIG. 3C illustrates the gain step diagram of the automatic gain control logic circuit in FIG. 2A according to one embodiment of the present invention, wherein the gain step increases by five steps for each adjusting step.

FIG. 3A illustrates atypical gain step diagram of the automatic gain control logic circuit 205 in FIG. 2A; FIG. 3B illustrates the gain step diagram of the automatic gain control logic circuit 205 in FIG. 2A according to one embodiment of the present invention; and FIG. 3C illustrates the gain step diagram of the automatic gain control logic circuit 205 in FIG. 2A according to one embodiment of the present invention.

As shown in FIG. 3A, the gain step is increased by 1 step for each adjusting step when the control signal 208 indicates a normal mode, wherein the total settling time is 1031 us. As shown in FIG. 3B, the gain step can be increased by 3 steps for each adjusting step when the control signal 208 indicates a fast mode, wherein the total settling time is 406 us. As shown in FIG. 3C, the gain step can be increased by 5 steps for each adjusting step when the control signal 208 indicates a fast mode, wherein the total settling time is 281 us.

In one embodiment, the signals inputted to the automatic gain control circuit 200 are RF signals.

In one embodiment, the signals inputted to the automatic gain control circuit 200 are IF signals.

In one embodiment, the amplifier is an LNA (low-noise amplifier) for amplifying RF signals.

The foregoing descriptions of specific embodiments of the present invention have been presented for purposes of illustrations and description. They are not intended to be exclusive or to limit the invention to the precise forms disclosed, and many modifications and variations are possible in light of the above teaching. The embodiments were chosen and described to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An automatic gain control circuit, for controlling an amplifier for receiving signals, said automatic gain control circuit comprising: a power detector coupled to the amplifier, wherein the power detector receives a first signal outputted from the amplifier and outputs a first voltage level representing a first power level of the first signal; a control circuit for controlling the power detector, wherein the control circuit detects a power level change of the first signal and generates a control signal to the power detector for responding to the power level change of the first signal.

2. The automatic gain control circuit according to claim 1, wherein the control circuit comprises a voltage level detector that receives the first signal and outputs a second voltage level representing a second power level of the first signal, wherein the control signal is switching from a first logic level to a second logic level that is maintained for a pre-defined period when the second voltage level becomes smaller than a pre-defined low-threshold.

3. The automatic gain control circuit according to claim 2, wherein the control signal is switching from the first logic level to the second logic level that is maintained for the pre-defined period when the second voltage level becomes larger than a pre-defined high-threshold.

4. The automatic gain control circuit according to claim 3, wherein the second logic level of the control signal is a logic low-level representing a fast mode, and the first logic level of the control signal is a logic high-level representing a normal mode.

5. The automatic gain control circuit according to claim 3, wherein said power detector comprises a peak voltage detector and an RMS voltage detector, wherein the output of the peak voltage detector is selected for generating the first voltage level representing the first power level of the first signal when the control signal is in a normal mode, and the output of the RMS voltage detector is selected for generating the first voltage level representing the first power level of the first signal when the control signal is in a fast mode.

6. The automatic gain control circuit according to claim 3, wherein said power detector comprises a peak voltage detector with an RC filter, wherein the RC filter has a first discharging time constant when the control signal is in a fast mode, and the RC filter has a second discharging time constant when the control signal is in a normal mode, wherein the first discharging time constant is shorter than the second discharging time constant.

7. The automatic gain control circuit according to claim 2, wherein the voltage level detector comprises an RMS voltage detector that is coupled to the first signal and outputs the second voltage level representing the second power level of the first signal.

8. The automatic gain control circuit according to claim 7, wherein the control circuit comprises a first comparator, a second comparator, and a flag generator, wherein the first comparator compares the second voltage level outputted from the RMS voltage detector with a pre-defined high-threshold, and the second comparator compares the power level outputted from the RMS power level detector with a pre-defined low-threshold, wherein the flag generator generates the control signal according to outputs of the first comparator and the second comparator.

9. The automatic gain control circuit according to claim 8, wherein a clock is inputted to the flag generator, wherein the pre-defined period is generated according to the clock period of the clock.

10. The automatic gain control circuit according to claim 2, wherein said power detector comprises a peak voltage detector and an RMS voltage detector, wherein the output of the peak voltage detector is selected for generating the first voltage level representing the first power level of the first signal when the control signal is in a normal mode, and the output of the RMS voltage detector is selected for generating the first voltage level representing the first power level of the first signal when the control signal is in a fast mode.

11. The automatic gain control circuit according to claim 2, wherein said power detector comprises a peak voltage detector with an RC filter, wherein the RC filter has a first discharging time constant when the control signal is in a fast mode, and the RC filter has a second discharging time constant when the control signal is in a normal mode, wherein the first discharging time constant is shorter than the second discharging time constant.

12. The automatic gain control circuit according to claim 1, wherein the automatic gain control circuit comprises an automatic gain control logic circuit, wherein the control circuit sends the control signal to the automatic gain control logic circuit for adjusting the gain step of the automatic gain control logic circuit to cut short the total settling time in response to the power level change of the first signal.

13. The automatic gain control circuit according to claim 12, wherein the control circuit sends the control signal to the automatic gain control logic circuit for adjusting the speed of a clock that is used by the automatic gain control logic circuit.

14. The automatic gain control circuit according to claim 1, wherein the signals are RF signals.

15. The automatic gain control circuit according to claim 14, wherein the amplifier is an LNA (low-noise amplifier) for amplifying RF signals.

16. The automatic gain control circuit according to claim 1, wherein the signals are IF signals.

\* \* \* \* \*